United States Patent [19]
Wu

[11] Patent Number: 6,121,090
[45] Date of Patent: Sep. 19, 2000

[54] SELF-ALIGNED SILICIDED MOS DEVICES WITH AN EXTENDED S/D JUNCTION AND AN ESD PROTECTION CIRCUIT

[75] Inventor: Shye-Lin Wu, Hsinchu, Taiwan

[73] Assignee: Texas Instruments - Acer Incorporated, Hsinchu, Taiwan

[21] Appl. No.: 09/062,829

[22] Filed: Apr. 20, 1998

[51] Int. Cl.$^7$ .............................................. H01L 21/8238
[52] U.S. Cl. ...................... 438/275; 438/305; 438/530; 438/664; 257/355
[58] Field of Search .................................. 438/664, 514, 438/522, 523, 530, 533, 649, 683, 275, 305, 306; 257/355

[56] References Cited

U.S. PATENT DOCUMENTS

| | | | |
|---|---|---|---|
| 4,753,898 | 6/1988 | Parrillo et al. | 438/231 |
| 4,855,247 | 8/1989 | Ma et al. | 438/305 |
| 5,320,974 | 6/1994 | Hori et al. | 438/302 |
| 5,358,879 | 10/1994 | Brady et al. | 438/163 |
| 5,585,299 | 12/1996 | Hsu | 438/275 |
| 5,610,088 | 3/1997 | Chang et al. | 438/231 |
| 5,643,825 | 7/1997 | Gardner et al. | 438/275 |
| 5,659,194 | 8/1997 | Iwamatsu et al. | 257/377 |
| 5,672,527 | 9/1997 | Lee | 438/275 |
| 5,780,350 | 7/1998 | Kapoor | 438/305 |

OTHER PUBLICATIONS

Bijan Davari, CMOS Technology Scaling, 0.1$\mu$m and Beyond, 1996 IEEE, pp. 555–558.
Ajith Amerasekera et al., Correlating Drain Junction Scaling, Salicide Thickness, and Lateral NPN Behavior, with the ESD/EOS Performance of a 0.25$\mu$m CMOS Process, 1996 IEEE, pp. 893–896.

*Primary Examiner*—George Fourson
*Assistant Examiner*—Kurt Eaton
*Attorney, Agent, or Firm*—Harness, Dickey & Pierce, P.L.C.

[57] ABSTRACT

A method for fabricating simultaneously a self-aligned silicided and an ESD protective transistor is disclosed. To improve operation speed, the MOS transistor is manufactured with an extended S/D junction; however, there is no salicide and LDD and, with a normal junction in the ESD protective transistor. The method comprises the steps of: thermally grown oxide layers on a defined source/drain region and a poly-Si surface of the gate structure, Then, a photoresist is masked on the functional device, and n-type ions are implanted to form a source/drain region in the ESD protection device. Then the photoresist is removed so as to form a nitride layer on all exposed surfaces of the substrate. An anisotropic etching back the nitride layer to form spacers on sidewalls of the gate structure in the functional device by using a photoresist on the ESD protective device is followed. After that the photoresist on the ESD protection device is removed then a salicidation technology is applied to form the silicide and polycide on S/D and poly-gate, respectively, by using nitride layer as a hard mask. N-type ions are implanted into and/or through the silicide, and thermal annealing is then followed to form an ultra-shallow junction in the functional device. For forming an extended source/drain in the functional device, all nitride layer is removed firstly. Next n-type ions, low energy ion implantation is carried out on the entire substrate. A thick CVD oxide layer is then deposited on all areas. Finally, a RTP anneal is performed to densify the oxide layer and activate dopants to form the extended S/D junction.

19 Claims, 6 Drawing Sheets

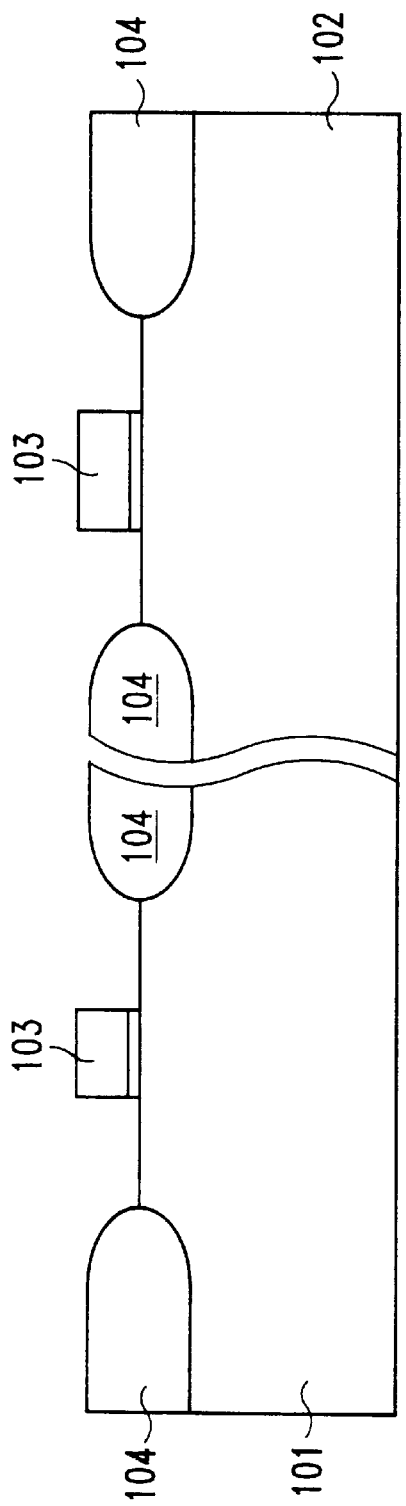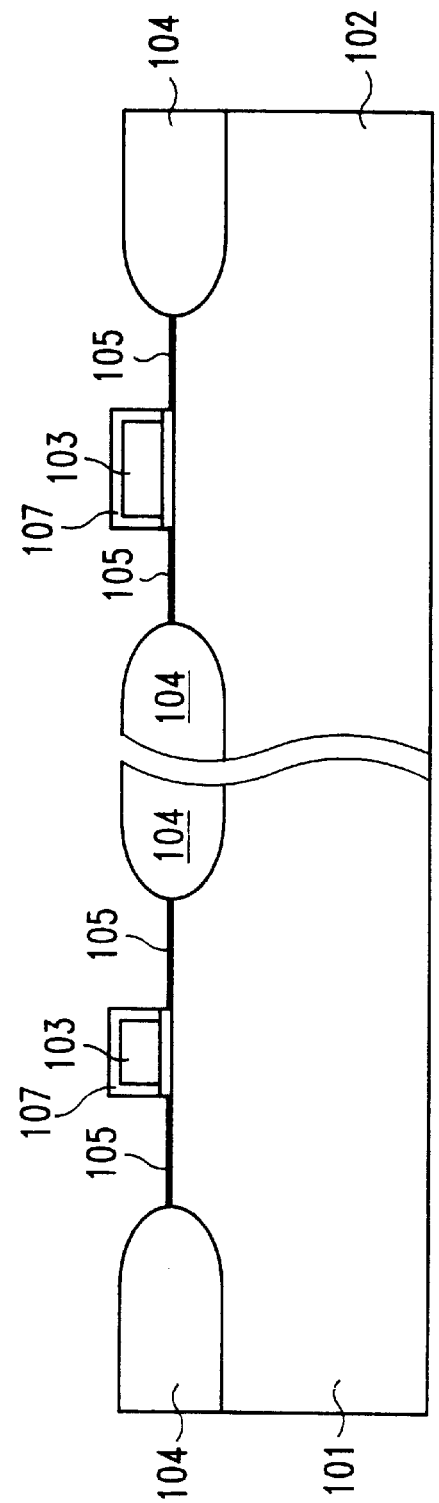

SELF-ALIGNED SILICIDED MOS DEVICES WITH AN EXTENDED S/D JUNCTION AND AN ESD PROTECTION CIRCUIT

FIELD OF THE INVENTION

The present invention relates to a semiconductor device process, and more specifically, to a method of fabricating self-aligned silicided MOS devices with an extended S/D junction and an ESD protection circuit.

BACKGROUND OF THE INVENTION

The rapid advance of microelectronic technology is prone to scale the device dimension down in order to improve speed and reduce the cost per unit device. For example, as stated by Davari, in the reference, "B. Davari, "CMOS Technology Scaling, 0.1 $\mu$m and Beyond" IEDM Tech. Dig. P.555 (1996), device speed enhancement of about 3×, circuit density improvement of 8×, and 20–40× improvement in power-delay product will be achieved by scaling the CMOS technologies down to the sub-0.1 $\mu$m regime, operating in the 1V range, as compared with performance of 0.35 $\mu$m devices at 3.3V.

However, as device feature size moves from submicron or even down to deep-submicron ranges, more stringent problems may arise. For example, hot carrier, punchthrough effects, mobility degradation, body effects and lithography technology issues all demand to be overcome. In addition, accompanying the with miniaturizing of the feature sizes of the devices, the vertical dimension also need to be shrunk so as to improve the device characteristics, thus the reduction in the junction depth of devices becomes critical. Nevertheless the lateral spreading resistance and contact resistance of a shallow junction are often too large and, as a result, the parasitic resistance may slow down the device speed.

In recent years, for deep-submicron region devices, a self-aligned silicided technology has attracted much attention for its practical application for example, the salicide provides not only low-sheet resistance for S/D regions and for gate electrode in MOS devices but also a very clean silicide-silicon interface. Besides, it reduces at least one mask count and no additional etching step is required other than that of the conventional silicided formation method.

However, a 0.25 $\mu$m feature size of the device requires a junction depth of less than 0.1 $\mu$m, and the silicidation of such a shallow source/drain junction will consume a portion of the high doping region. Thus an obstacle for the silicidation of forming such an ultra-shallow junction comes from the non-uniform silicide/silicon interface which may lead to local spiking of the junction. To prevent excessive junction leakage resulting from the silicidation process, one of the effective approaches includes forming a thinner silicide than the junction, and forming the contact silicide layer before conducting the ion implantation for junction formation.

Another critical issue associated with the feature size the MOSFET scale down and degrades significantly the device performance is electrostatic discharge (ESD). However, it is known to have a poor ESD property for the transistors with an LDD structure, which is used to prohibit the hot carrier-induced degradation in MOS devices. The ESD is easily conducted through the input/output and power lead connections into the internal devices to destroy the devices. For example, as junction depth becomes shallower, the properties of integrated circuits are easily deteriorated by the human body. The high voltage can be accidentally applied to the pins of the IC package by a person while handling, and may cause the breakdown of the gate oxide of the devices. Thus, it is imperative that a built-in preventing ESD circuitry to prevent damage to the thin gate oxide of MOS transistor is formed simultaneously with the functional transistors.

Nevertheless, the devices with shallow junctions and self-aligned silicided contacts show a negative impact on electrostatic discharge (ESD) performance than the non-silicided devices. Amerasekera et al. in "Correlating Drain Junction Scaling, Salicide Thickness, and Lateral NPN Behavior, with the ESD/EOS Performance of 0.25 $\mu$M CMOS Process," IEDM Tech. Dig. (1996) P.893, investigated the relationship between the current gain $\beta$ of a self-biased lateral NPN (parasitic bipolar in a NMOS) transistor and the ESD performance, and found that devices with lower $\beta$ are observed to have lower ESD performance. Further, they also suggested that $\beta$ is found to be strongly influenced by the effective drain/source diffusion depth below the salicide which is determined by the implant energy as well as the amount of active diffusion consumed in silicidation. Thus, it is essential to develop a salicide process in the ULSI devices but use additional processes to block the salicide and/or to use an extra implant to make the junction deeper in the ESD protective circuitry when the fabrication of both devices is performed at the same time. A minimal influence on the ESD performance would be expected.

SUMMARY OF THE INVENTION

The present invention discloses a method of fabricating simultaneously a self-aligned silicided MOS transistor with an extended S/D junction and an ESD protective transistor in a silicon substrate. Each device has a defined source, drain, gate structure and is separated by an isolation region. The method comprises the following steps Thermally growing pad oxide, and poly-oxide layers on defined source/drain regions and poly-Si surfaces of the gate structures, respectively, so that etching damages for forming the gate structures are recovered. Then, masking a photoresist on the functional device of the substrate. A species of n-type ions is implanted into the ESD protective device to form a source/drain in the ESD protection region. Then the photoresist is removed so as to form a nitride layer on all exposed surfaces of the substrate. After that, a second mask on the ESD protective device of the substrate is done, followed by an anisotropic etching back the nitride layer to form spacers on sidewalls of the gate structure in the functional device. The second mask on the ESD protection device is removed, then a metal layer is sputtered or deposited by a CVD method on the entire surface of the substrate: A silicidation is done by a first stage thermally anneal of the substrate. Subsequently, the unreacted metal layer on the isolation regionsis removed, and the spacers achieved by using a wet etching technology. A species of n-type ions is implanted into and/or through the silicide and the polycide of the substrate, a second stage thermally anneal of the substrate then follows, so that an ultra-shallow p-n junction in the functional device is formed, and a stable, low resistance silicide phase is transformed. For forming an extended source/drain in the functional device, the nitride layer is first removed. Next a species of n-type ions, low energy ion implantation is carried out on the entire substrate. A thick CVD oxide layer is then deposited on all areas. Finally, a rapid thermal process is performed to density the oxide layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 1. is a cross-sectional view of the NMOS devices and the ESD protective device, each device with a defined gate structure, according to the prior art;

FIG. 2. is a cross-sectional view of the pad oxide and poly-oxide are grown on the substrate and the poly-gate, respectively, according to the present invention;

DETAILED DESCRIPTION OF THE PREFERRED EMBODIMENT

Figure 3:
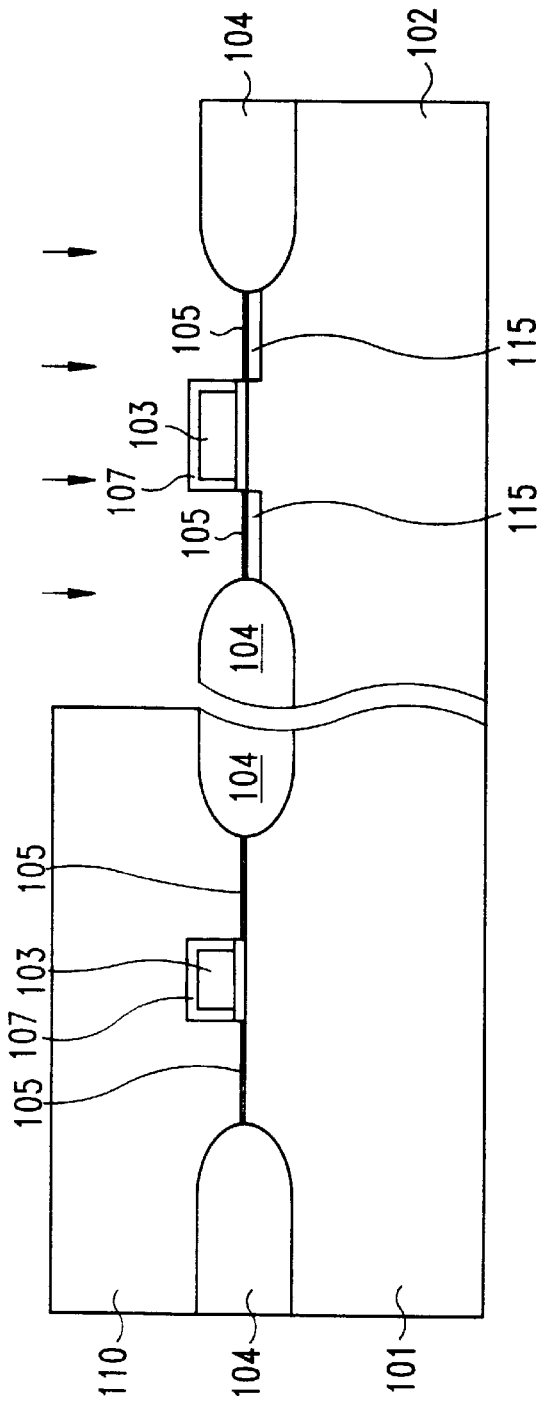
FIG. 3. is a cross-sectional view of performing a n+ S/D implantation in the ESD protective device according to the present invention.

A method by which self-aligned silicided MOS devices with an extended source/drain (S/D) junction and an electrostatic discharge (ESD) protection circuit are formed simultaneously is provided in the present invention. The detailed processes will be described as follows.

FIG. 1 shows a cross-sectional view of regions on a <001> orientation silicon substrate for forming functional devices 101 and an ESD protection device 102. Each device with a defined poly-Si /oxide gate 103 and source/drain are spaced by an isolation region 104. The method for patterning the poly-silicon gate structure 103 and for forming isolation regions 104 is known in the art, therefore, it will not be described in detail.

For the purpose of recovering the etching damage, as shown in FIG. 2, a thin pad oxide 105 and a poly-oxide 107 are grown on all surfaces of defined source/drain of the substrate and the surface of poly-silicon, respectively. In a preferred embodiment, the pad oxide 105 and the poly-oxide layers 107 are thermally regrown at a temperature of about 700–1000° C. in $O_2$ ambient. Since the grain boundaries in poly-silicon of the portion of poly-gate structure 103 can provide faster diffusion paths for oxygen atoms, the thickness of poly-oxide layers 107 is thus thicker than that of the pad oxide 105 as expected. The thickness of the pad oxide 105 and the poly-oxide 107 on the surface of source/drain are about 2–20 nm and about 4–25 nm, respectively.

Referring to FIG. 3, a photoresist 110 via lithography technology is performed by a masking step on the surface of functional device 101. N-type, high dose ions are implanted (as indicated by arrows) into the ESD protective device region to form a source/drain junction 115. In a preferred embodiment, the n-type ions can be phosphorus ions, or arsenic ions or both (double implant or co-implant). The energy and dosage be used in the implantation are about 10–150 keV and about $5\times10^{14}$ to $5\times10^{16}/cm^2$, respectively.

Figure 4:
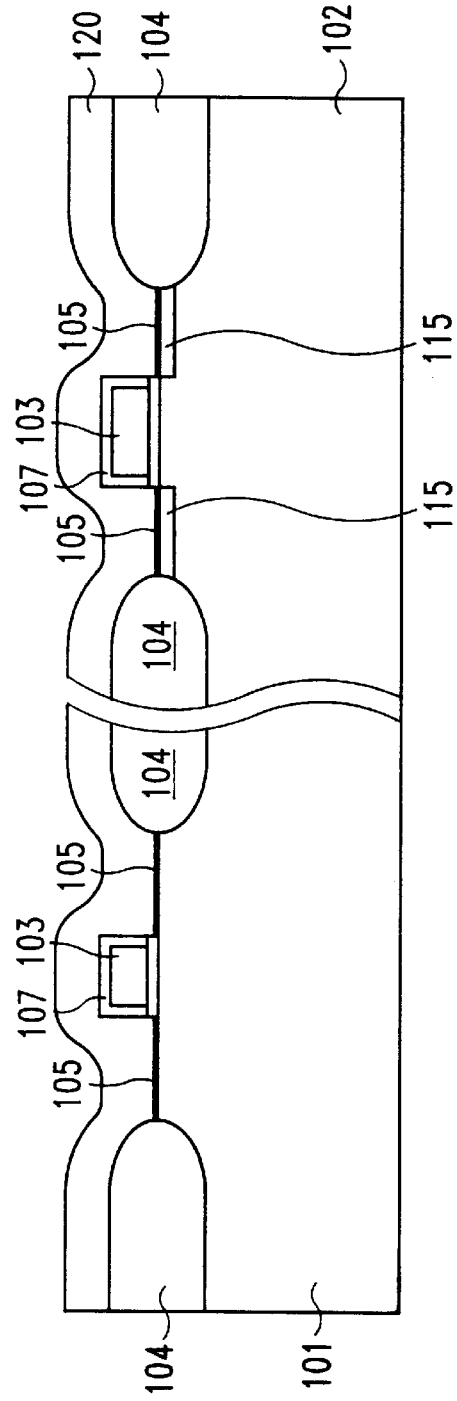
FIG. 4. is a cross-sectional view of forming a CVD nitride layer on all areas, according to the present invention.
Figure 5:
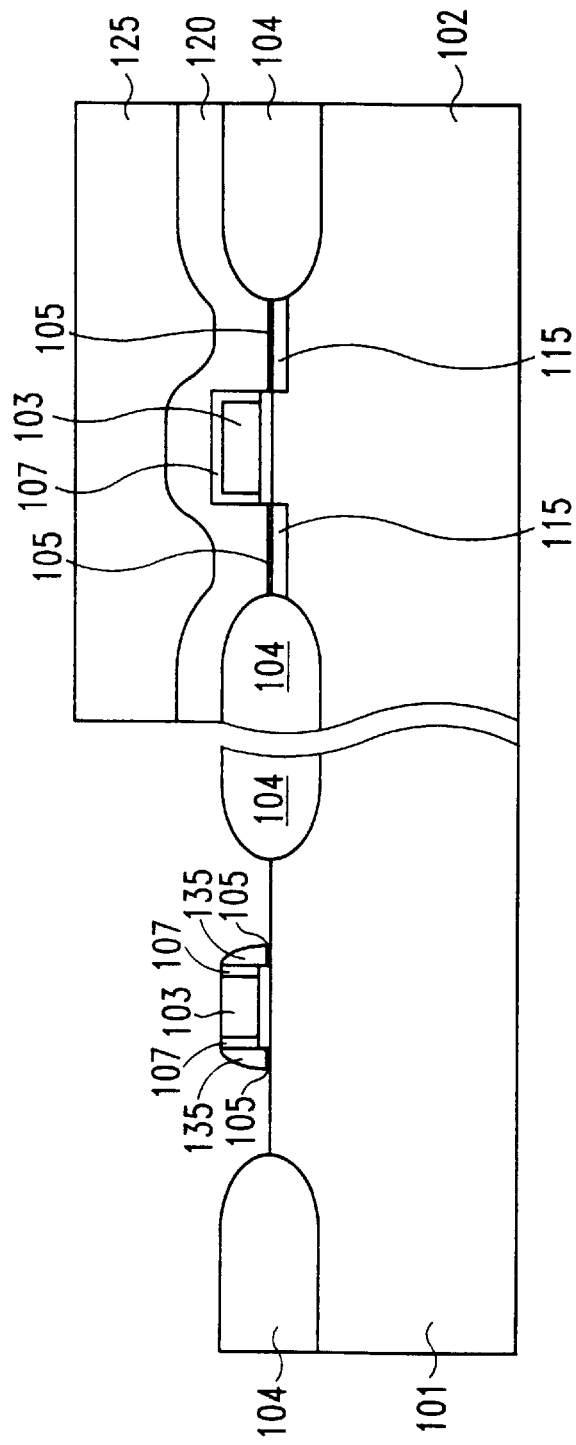
FIG. 5. is a cross-sectional view of an anisotropic etching which is done to form nitride spacer in the functional device by using a photoresist on ESD protective device as a mask, according to the present invention.

As shown in FIG. 4, a stripping of the photoresist 110 on the functional device occurs, then a CVD nitride layer 120 is deposited on all surfaces of the functional devices and the ESD protective device. Preferably, a low-pressure CVD (LPCVD) is preformed at a temperature of about 600–800° C. A next photoresist 125 subsequently masks on the ESD protective device 102 of the substrate 100. An anisotropic plasma etching then etches back the nitride layer 120 of the functional device 101 to form nitride spacers 135 on the sidewalls of gate structure 103. It is noted that the poly-oxide layer 107 on the top of the poly-gate structure serves as an etching stop to alleviate an over-etching on the gate structure. In addition, the thin pad oxide 105 on the defined S/D region 128 of the functional region 101 is also removed during dry etching. The results are shown in FIG. 5.

Figure 6:
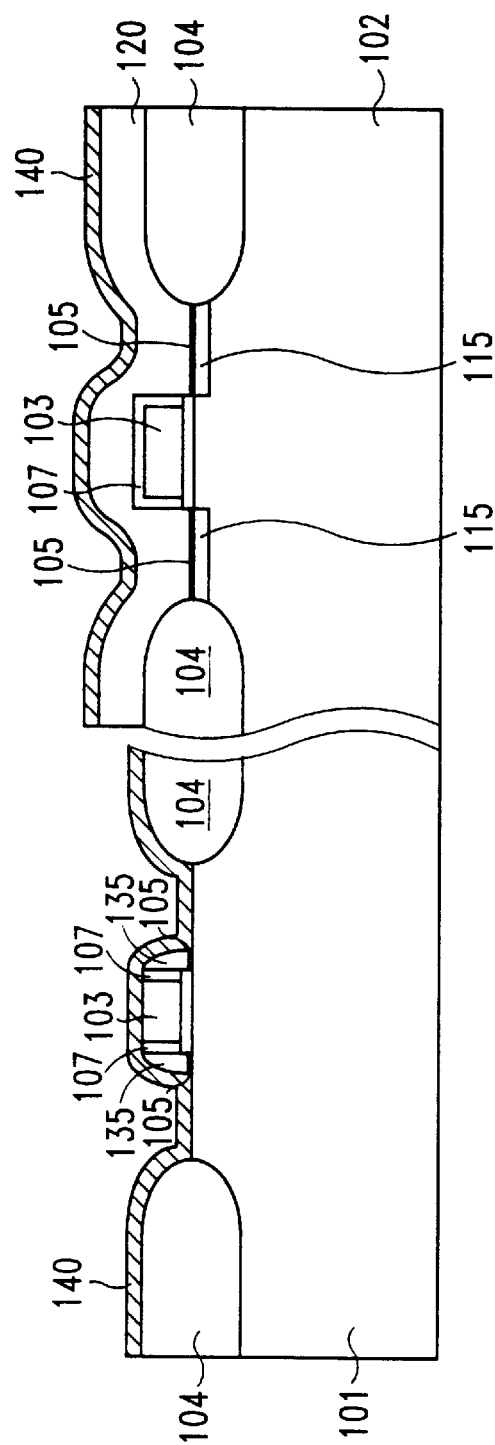
FIG. 6. is a cross-sectional view of sputtering or CVD a metal layer on all the surfaces, according to the present invention.

Referring to FIG. 6, after removing the photoresist 125 on the ESD protective device 102, then a refractory or a noble metal layer 140 (e.g., Ti, W, Co, Ni, Pt, Cr, Pd or the combination thereof) is blanket deposited on all areas. Preferably, the thickness of the metal layer is about 10 to 100 nm. The metal deposition can be performed by a CVD or a sputtering technology.

Figure 7:
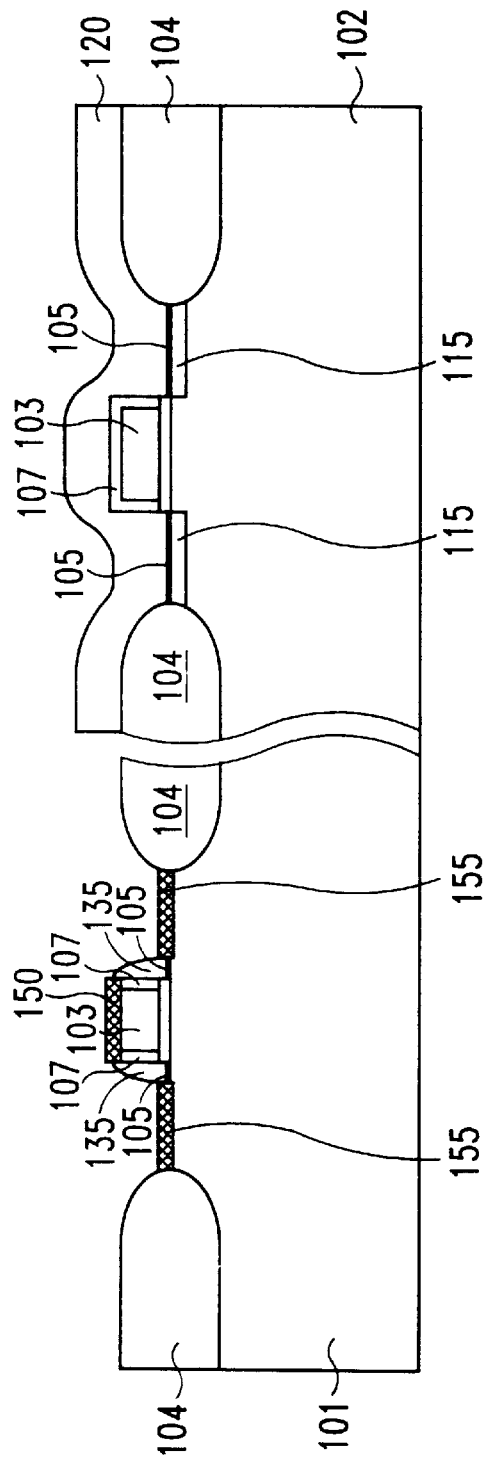
FIG. 7. is a cross-sectional view of a salicidation on the surface of S/D and gate in the functional device achieved by annealing, then the removal of unreacted metal is performed, according to the present invention.

As shown FIG. 7, a first-step thermal process is done to form silicide at a temperature of about 300° C. to 700° C. in nitrogen ambient. The metal layer 140 reacts with poly-Si or silicon substrate, and then a polycide layer 150 and a silicide layer 155 are formed, respectively, on the top surface of the poly-gate 103 and on the source/drain regions of functional region 101. Some of unreacted metal layers (on the isolation region 104 and the spacers 135) are then selectively removed through the use of an etchant that does not attack the silicide, the silicon substrate, or the $SiO_2$. Preferably, the removal of the unreacted metal layers can be done by a wet etching using a solution containing $NH_4OH$, $H_2O$ and $H_2O_2$.

Figure 8:
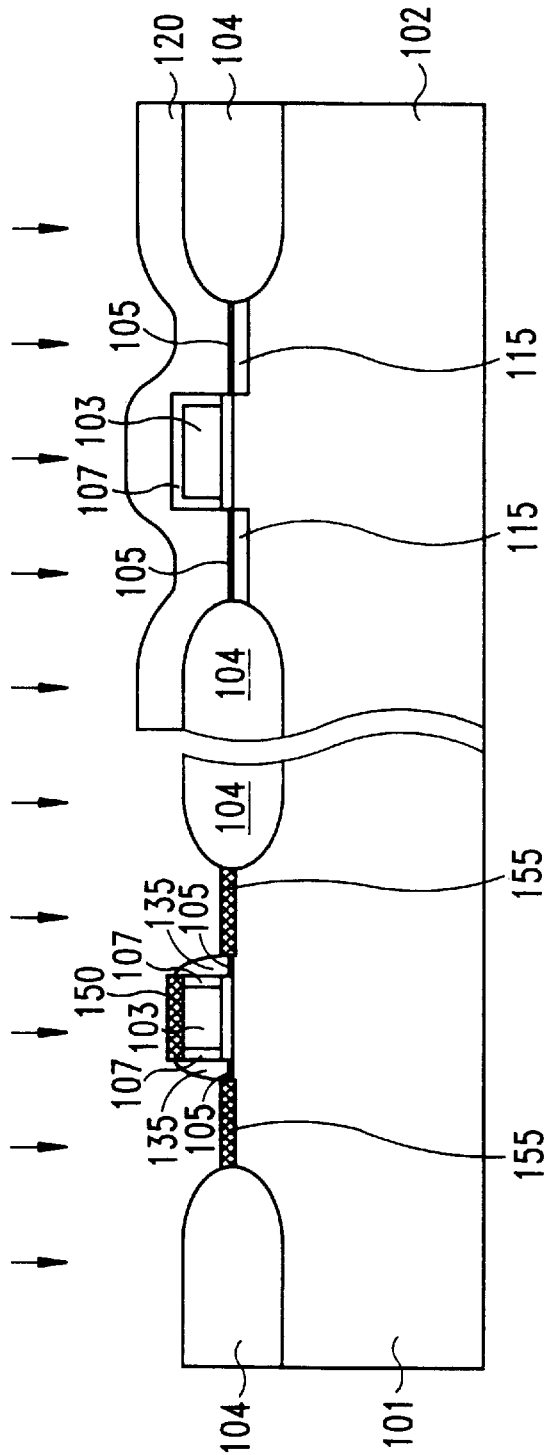
FIG. 8. is a cross-sectional view of a result of n+ S/D implantation which is implanted into a functional device, according to the present invention.

Referring to FIG. 8, an ion implantation technology using a species of n-type ions is thereafter blanked implanted into and/or through polycide 150 or silicide layers 155 of functional regions 101. The species of n-type ions such as phosphorus, arsenic, or antimony ions etc are preferred. The energy and dosage be used in the implantation are about 0.5 to 100 keV and about $5\times10^{14}$ to $5\times10^{16}/cm^2$, respectively.

Figure 9:
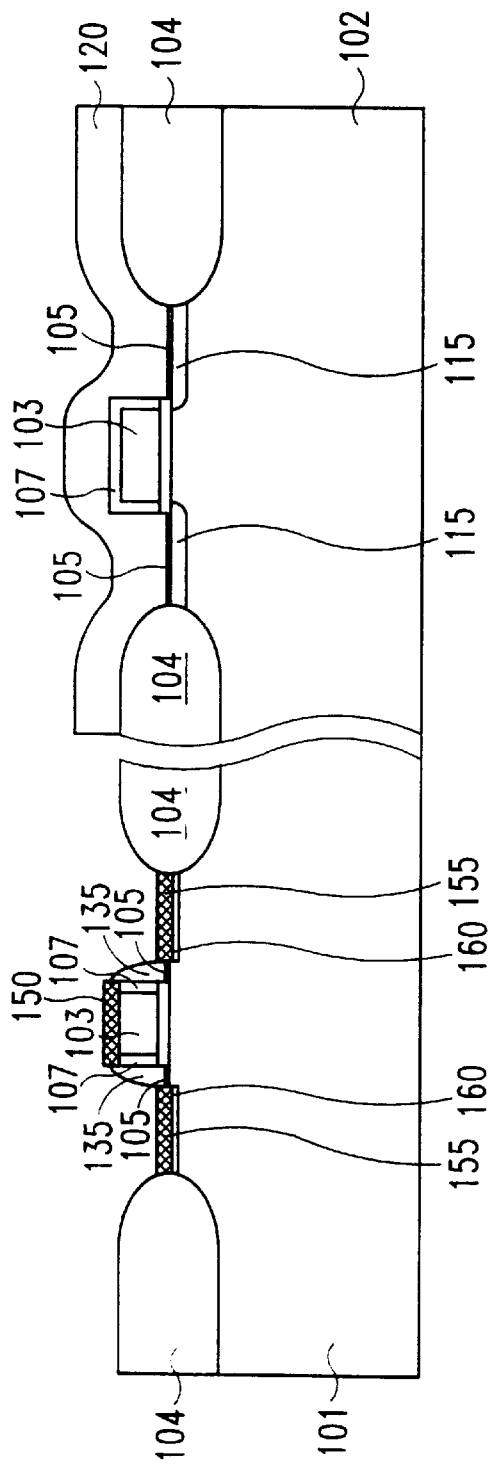
FIG. 9. is a cross-sectional view of an RTA anneal to form an ultra-shallow p-n junction in the functional devices, according to the present invention.

FIG. 9 depicts a result of the second-step rapid thermal process that achieved at a high temperature of about 750° C. to 1150° C. for 5 s to 180 s. The silicide formed at first-step annealing will transform to a lower sheet resistance and stable phase silicide. Furthermore, the dopants in the silicide 155 and the polycide 150 layer serve as diffusion source and are driven into the substrate to form an ultra-shallow S/D 160 junction in the functional device 101. In addition, the dopant impurities in S/D region 115 of the ESD protective devices also diff-used to form a deeper S/D junction 115. The impurities will also be activated at the same time.

Figure 10:
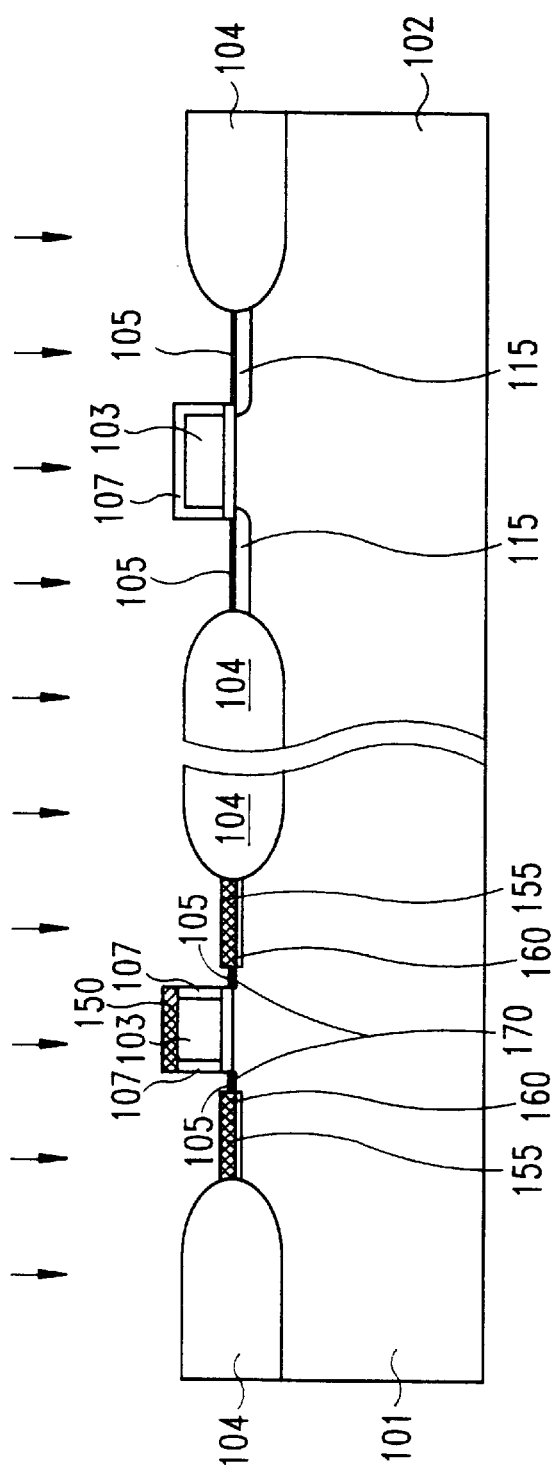
FIG. 10. is a cross-sectional view of a removal of all nitride layer done, followed by a low energy extended S/D implant.

Then, as shown in FIG. 10, the removal of the silicon nitride layer 120 and the nitride spacers 135 are subsequently achieved. Preferably, a wet etchant containing reflux boiling 85% phosphoric acid at 180° C. is used for it has significantly different etching rates compared to nitride and oxide. The patterned oxide, such as pad oxide, serves as an etching stop mask for the nitride in the phosphoric acid etch. Thereafter, a low energy ion implantation using n-type ions, such as phosphorus, arsenic, or antimony ions, into entire areas is performed so as to form extended S/D regions 170 in positions adjacent the silicide layer 150 of the functional devices. The energy and dosage are about 0.1 to 30 keV and about $5\times10^{12}$ to $5\times10^{14}/cm^2$, respectively.

Figure 11:
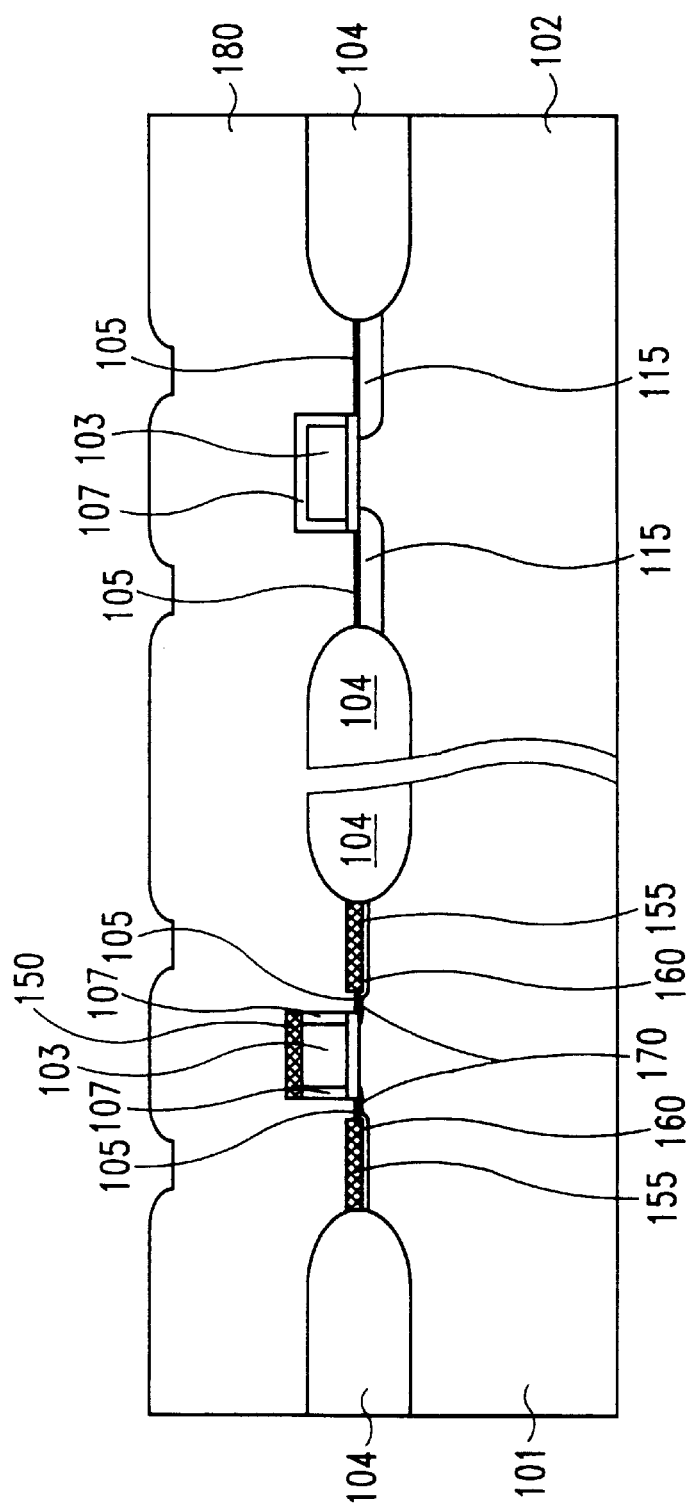
FIG. 11. is a cross-sectional view of a thick CVD oxide layer deposited on all areas, followed by a RTP annealing to densify the oxide layer.

Referring to FIG. 11, an insulating layer 180 is deposited by a CVD method on all top surfaces of the substrate. In this preferred embodiment, a low-dielectric-constant thick oxide layer 180 is deposited. The deposition can be achieved either by a PECVD method which has the excellent properties such as low temperature (the temperature are between 300 and 550° C.), fast deposition, good step converge, and so on, or by a higher temperature, low pressure CVD process to enhance thermal stability and to improve conformal converge. For the purpose of improving the insulating properties of oxide layer 180, another high temperature RTP anneal at a temperature of about 800–1100° C. or a $N_2$ diffusion furnace anneal at a temperature of about 750–950° C. is used. Therefore, the oxide layer 180 is condensed, and ultra-shallow extended S/D junctions 170 and normal S/D junctions in the protective device are formed simultaneously.

The benefits of this invention are:
(1) The circuit operation speed could be significantly improved due to the functional MOS devices having a self-aligned silicided contact and an extended ultra-shallow junction; and
(2) a high ESD protective voltage could be obtained due to non-silicided and non-LDD structures applied to the protective circuit.

As is understood by a person skilled in the art, the foregoing preferred embodiment of the present invention is an illustration of the present invention rather than being limiting thereon. It is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention. For example, in the method, some portion of the steps proposed for fabricating self-aligned silicided MOS devices with an extended source/drain (S/D) junction and an electrostatic discharge (ESD) protection circuit could be swapped. (For example, the steps for ESD n+ S/D implantation as shown in FIG. 3 can be postponed until the nitride layer 120 are removed and are accompanied with n+ S/D implantation in functional device.).

What is claim is:

1. A method for fabricating a self-aligned silicided MOS transistor with an extended S/D junction in a functional device and an ESD protective device on a silicon substrate which has a defined gate structure, a defined source/drain and each device separated by an isolated region, said method comprising the steps of:
   1. forming a pad oxide, and poly-oxide layer on said defined source/drain and on all surfaces of a poly-SI of said defined gate structure, respectively;
   2. forming a first mask on said functional device of said substrate;
   3. performing a first stage ion implantation so that said defined source/drain in said ESD protective device is doped;
   4. removing said first mask;
   5. forming a first insulating layer on all exposed surfaces of said substrate;
   6. forming a second mask on said ESD protective device of said substrate;
   7. performing an anisotropic etching back said first insulating layer of exposed areas to form spacers on sidewalls of said defined gate structure in said functional device;
   8. removing said second mask;
   9. forming a metal layer on all exposed surfaces of said substrate;
   10. performing a first thermal annealing said substrate, so that a silicide layer and a polycide layer are formed, respectively, on said defined source/drain and said defined gate structure of functional device;
   11. removing unreacted metal layer on said isolation region, and said spacers;
   12. performing a second stage ion implantation into and/or through said silicide layer and said polycide layer of said substrate, so that said silicide layer and polycide layer on said defined source/drain and on said defined gate structure are doped respectively;
   13. a performing a second thermal annealing said substrate, so that an ultra-shallow source/drain junction in the functional device is formed;
   14. removing said first insulating layer of said ESD protective device and spacers of sidewalls of said defined gate structure in said functional device;
   15. performing a third stage ion implantation so that an extended source/drain is formed in said functional device, and dopants in said protective device are enhanced;
   16. performing a second insulating layer deposition on entire surfaces of said substrate; and
   17. performing a third thermal annealing said substrate so that said second insulating layer is condensed.

2. The method of claim 1, wherein said pad oxide, and poly-oxide layers is formed by thermally grown at a temperature of about 700–1000° C. to about 2–20 nm and 4–25 nm in thickness, respectively.

3. The method of claim 1, wherein said first stage of ion implantation is implanted by using n-type ions with an energy and a dosage of about 10–150 keV and of about $5\times10^{14}$ to $5\times10^{16}/cm^2$, respectively.

4. The method of claim 1, wherein said first insulating layer is a silicon nitride.

5. The method of claim 1, wherein said metal layer is selected from a group consisting of Ti, Co, W, Pt, Ni, Cr, Pd and a combination thereof.

6. The method of claim 1, wherein said first thermal annealing is carried out at a temperature of about 300–700° C. and said second thermal annealing is done at a temperature of about 750–1150° C.

7. The method of claim 1, wherein said second stage of ion implantation is implanted by using a species of n-type ions with an energy and a dosage of about 0.5–100 keV and of about $5\times10^{14}$ to $5\times10^{16}/cm^2$, respectively.

8. The method of claim 1, wherein said secondly thermal annealing is carried out at a temperature of about 750–1150° C.

9. The method of claim 1, wherein said third stage of ion implantation is implanted by using a species of n-type ions with an energy and a dosage of about 0.1–30 keV and of about $5\times10^{12}$ to $5\times10^{14}/cm^2$, respectively.

10. The method of claim 1, wherein said performing a second insulating layer deposition is done at a temperature of about 300–800° C.

11. The method of claim 1, wherein said second insulating layer is an oxide layer.

12. The method of claim 1, wherein said third thermal annealing said substrate is carried out in a conventional furnace at a temperature of about 750–950° C.

13. The method of claim 1, wherein said third thermal annealing said substrate is carried out by RTP at a temperature of about 800–1100° C.

14. A method for fabricating a self-aligned silicided MOS transistor with an extended S/D junction in a functional device, and with an S/D junction in ESD protective device on a silicon substrate, said method comprising the steps of:

1. providing a respective gate structure defined thereon each said device, and each device being separated by an isolated region, thereby a respective source/drain region on each said device being defined;
2. forming a pad oxide, and poly-oxide layers on each said defined source/drain region and on all surfaces of a poly-Si of said gate structure, respectively;
3. forming a photoresist layer on said functional device; performing a first stage ion implantation, a species of n-type ions is implanted into said ESD protective device, so that said defined source/drain region in said ESD protection device is formed;
4. removing said first mask;
5. forming a silicon nitride layer on all exposed surfaces of said substrate;
6. forming a photoresist layer on said ESD protective device;
7. performing an anisotropic etching back said silicon nitride layer to form spacers on sidewalls of said gate structure in said functional device;
8. removing said photoresist layer;
9. forming a metal layer on all surfaces of said substrate;
10. performing a first thermal annealing so that a silicide layer and a polycide layer are formed, respectively, on said defined source/drain region and said gate structure of said functional device;
11. removing unreacted metal layer which is on said isolation region, said spacers in said functional device and said silicon nitride layer in said ESD device region;
12. performing a second stage ion implantation, a species of n-type ions is implanted into and/or through said silicide layer and said polycide layer of said substrate;
13. performing a second thermal annealing so that an ultra-shallow source/drain junction in the functional device is formed;
14. removing said silicon nitride layer of said ESD protective device and removing said spacers in said functional device;
15. performing a third stage ion implantation, a species of n-type ions is implanted all exposed areas, so that an extended source/drain region is formed in the functional device;
16. forming an oxide layer on entire surfaces of said substrate; and
17. performing a third thermal annealing so that said oxide layer is condensed.

15. The method of claim 14, wherein said a pad oxide layer, and poly-oxide layers are formed at a temperature of about 700–1000° C. to about 2–25 nm and 4–24 nm in thickness, respectively.

16. The method of claim 14, wherein said first stage of ion implantation is implanted with an energy and a dosage of about 10–150 keV and of about $5\times10^{14}$–$5\times10^{16}/cm^2$, respectively, said second stage of ion implantation is implanted with an energy and a dosage of about 0.5–100 keV and of about $5\times10^{14}$–$5\times10^{16}/cm^2$, respectively, further, said third stage of ion implantation is with an energy and a dosage of about 0.1–30 keV and of about $5\times10^{12}$–$5\times10^{14}/cm^2$, respectively.

17. The method of claim 14 wherein said metal layer having a thickness of about 10–100 nm is formed of a material selected from the group consisting of Ti, Co, W, Pt, Ni and a combination thereof.

18. The method of claim 14, wherein said steps of performing first and second thermal annealing are carried out, respectively, at a temperature of about 300–700° C. and 750–1150° C.

19. The method of claim 1, wherein said step of performing third thermal annealing is carried out in a conventional furnace at a temperature of about 750–950° C. or by RTP at a temperature of about 800–1100° C.

* * * * *